(12) United States Patent
Patel

(10) Patent No.: US 10,581,345 B2
(45) Date of Patent: Mar. 3, 2020

(54) MAGNETIC SHAPE MEMORY ALLOY ACTUATOR

(71) Applicant: United States of America as represented by the Administrator of NASA, Washington, DC (US)

(72) Inventor: Umeshkumar D. Patel, Herndon, VA (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 344 days.

(21) Appl. No.: 15/710,308

(22) Filed: Sep. 20, 2017

(65) Prior Publication Data

US 2019/0089268 A1 Mar. 21, 2019

(51) Int. Cl.
| | |
|---|---|
| *H02N 2/02* | (2006.01) |
| *F03G 7/06* | (2006.01) |
| *G01B 7/24* | (2006.01) |
| *G01B 7/16* | (2006.01) |
| *H01L 41/12* | (2006.01) |
| *H01L 41/20* | (2006.01) |

(52) U.S. Cl.
CPC ............... *H02N 2/02* (2013.01); *F03G 7/065* (2013.01); *G01B 7/18* (2013.01); *G01B 7/24* (2013.01); *H01L 41/12* (2013.01); *H01L 41/20* (2013.01)

(58) Field of Classification Search
CPC .. H02N 2/02; F03G 7/065; G01B 7/18; G01B 7/24; H01L 41/12; H01L 41/20
See application file for complete search history.

(56) References Cited

U.S. PATENT DOCUMENTS

| | | | |
|---|---|---|---|
| 7,456,530 B2 * | 11/2008 | Ohashi ................... | H01L 41/12 310/26 |
| 8,786,389 B1 * | 7/2014 | Cripe .................... | H01L 41/125 310/26 |
| 2010/0308689 A1 * | 12/2010 | Rahman ................. | E21B 23/00 310/328 |
| 2014/0091646 A1 * | 4/2014 | Schiepp ................. | H01L 41/12 310/26 |
| 2015/0207059 A1 * | 7/2015 | Laufenberg ............ | H01L 41/06 310/26 |

* cited by examiner

*Primary Examiner* — Bryan P Gordon
(74) *Attorney, Agent, or Firm* — Bryan A. Geurts; Matthew F. Johnston

(57) ABSTRACT

The present invention relates to an actuator based on a magnetic shape memory alloy (MSMA), a new family of crystalline materials which exhibit strain deformation >10% when subjected to a magnetic field. Electromagnetic fields can be applied with very short response times, making MSMA-based actuators kHz capable. These materials have the unique property of retaining their strained state when the driving field is removed, making them unique in the world of shape memory materials, and desirable as an actuator material as they will maintain position when powered off.

8 Claims, 5 Drawing Sheets

MAGNETIC SHAPE MEMORY ALLOY ACTUATOR

ORIGIN OF THE INVENTION

The invention described herein was made by employees of the United States Government, and may be manufactured or used by or for the Government for governmental purposes without the payment of any royalties thereon or therefor.

BACKGROUND OF THE INVENTION

1. Field of the Invention

The present invention relates to a linear actuator system using a magnetic shape memory alloy (MSMA), and capable of self-position sensing and power-off position maintenance.

2. Description of the Related Art

Active or smart materials are substances that can change their properties in response to physical disturbances. Many of these materials are limited to small strains. Most piezoelectric and magnetorestrictive materials have a high stiffness, requiring a strong force to induce any strain.

Similar to conventional shape memory alloys (SMAs), magnetic shape memory alloys (MSMAs) exhibit a large, reversible shape change related to a crystal structural transformation. However, unlike conventional SMAs, which utilize temperature or voltage as the control parameter, MSMAs are driven by a magnetic field.

MSMAs require no lubrication and can run at cryogenic temperatures, thus, allowing them to function in areas such as outer space, for millions of cycles. Since the ferromagnetic material is activated by a magnetic field which is easy and fast to apply, MSMAs have a much higher response time.

Accordingly, MSMAs are of interest in modern microactuator and micro-sensor dominated automation, since they perform better than current active materials used for precision actuators, exhibiting lower stiffness, higher bandwidth, higher accuracy, and require less power compared to other materials. Further, MSMA technology would reduce costs by eliminating expensive sensors.

SUMMARY OF THE INVENTION

The present invention relates to an actuator based on a magnetic shape memory alloy (MSMA), a new family of crystalline materials which exhibit strain deformation >10% when subjected to a magnetic field. Electromagnetic fields can be applied with very short response times, making MSMA-based actuators kHz capable. These materials have the unique property of retaining their strained state when the driving field is removed, making them unique in the world of shape memory materials, and desirable as an actuator material as they will maintain position when powered off. Furthermore, the magnetic-field-induced deformation is permanent or reversible.

In one embodiment, an actuator, includes: a plurality of coils disposed in two sets of two coils, the plurality of coils which directs magnetic flux through a magnetic shape memory alloy (MSMA) disposed centrally to the two sets of two coils; wherein a positive current is provided through the two sets of two coils, such that of a resulting two bias fields, one bias field is weakened and the other bias field is strengthened, and for a negative current, one bias field is strengthened and the other bias field is weakened; and wherein a direction of displacement of the magnetic shape memory alloy (MSMA) is determined by a direction of a current applied to the two sets of two coils.

In one embodiment, in order to elongate the magnetic shape memory alloy (MSMA), the two sets of two coils drive a magnetic field perpendicular to an axis of motion.

In one embodiment, in order to contract the magnetic shape memory alloy (MSMA), the two sets of two coils drive a magnetic field parallel to an axis of motion.

In one embodiment, the two sets of two coils are inverted to restore the magnetic shape memory alloy (MSMA) after contraction.

In one embodiment, the magnetic shape memory alloy (MSMA) is an alloy of nickel, manganese and gallium (NiMnGa).

In one embodiment, the actuator provides a response up to 2 kHz, a strain of more than 6%, and a modulus of elasticity of 20-200 GPa.

In one embodiment, the actuator is used in a test fixture which induces the current pulses to elongate the magnetic shape memory alloy (MSMA) to a specific displacement, the test fixture including: a load cell which is used to measure a force created on the magnetic shape memory alloy (MSMA) using one of a rigid link or a spring link; a stage which is moved to vary a distance between the magnetic shape memory alloy (MSMA) and the load cell where the force measurement is taken; a Gauss-meter which measures the magnetic field through probe access ports disposed on either side of the magnetic shape memory alloy (MSMA); an electronics circuit which measures resistance change of the magnetic shape memory alloy (MSMA) and impedance change of the drive coils; and an Eddy current displacement sensor which measures the displacement of the magnetic shape memory alloy (MSMA) when the current and the force are applied.

In one embodiment, the actuator is used in any application requiring power-off position hold, such as instrument applications.

Thus, has been outlined, some features consistent with the present invention in order that the detailed description thereof that follows may be better understood, and in order that the present contribution to the art may be better appreciated. There are, of course, additional features consistent with the present invention that will be described below and which will form the subject matter of the claims appended hereto.

In this respect, before explaining at least one embodiment consistent with the present invention in detail, it is to be understood that the invention is not limited in its application to the details of construction and to the arrangements of the components set forth in the following description or illustrated in the drawings. Methods and apparatuses consistent with the present invention are capable of other embodiments and of being practiced and carried out in various ways. Also, it is to be understood that the phraseology and terminology employed herein, as well as the abstract included below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent construc-

DESCRIPTION OF THE INVENTION

The present invention relates to an actuator based on a magnetic shape memory alloy (MSMA), a new family of crystalline materials which exhibit strain deformation >10% when subjected to a magnetic field. Electromagnetic fields can be applied with very short response times, making MSMA-based actuators kHz capable. These materials have the unique property of retaining their strained state when the driving field is removed, making them unique in the world of shape memory materials, and desirable as an actuator material as they will maintain position when powered off. Furthermore, the magnetic-field-induced deformation is permanent or reversible.

Figure 1A:
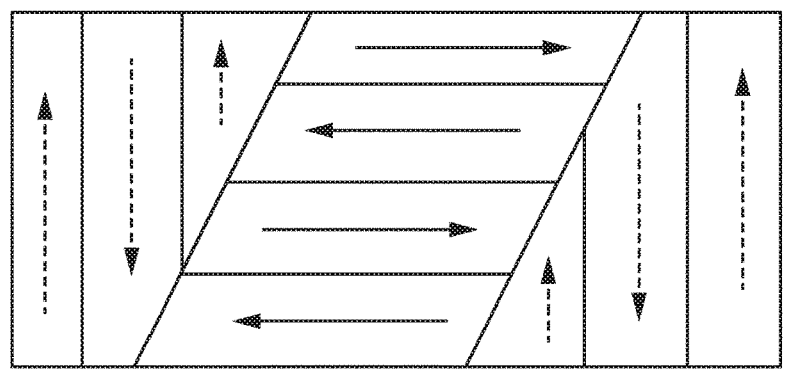
FIG. 1A shows variants in the MSMA, according to one embodiment consistent with the present invention.
Figure 1B:
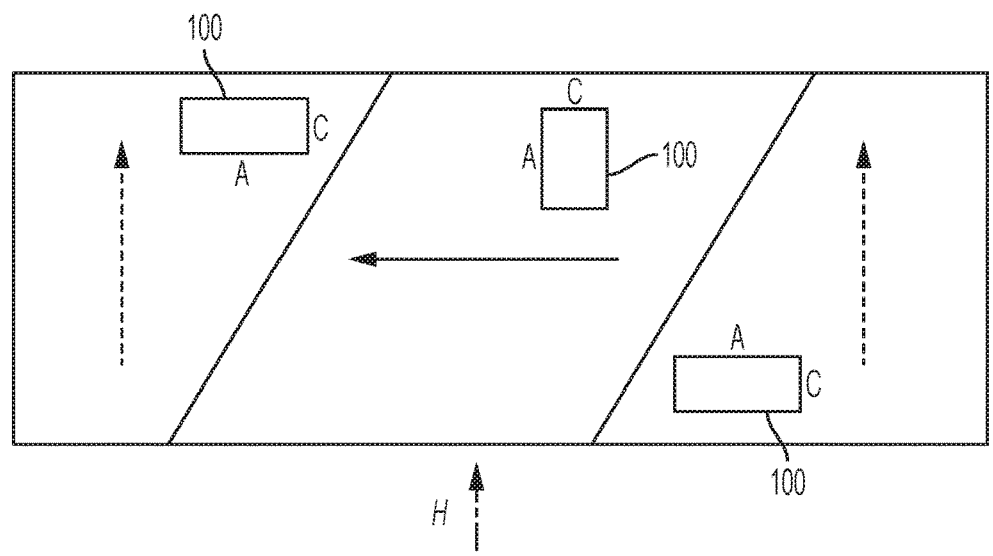
FIG. 1B shows a small magnetic field being applied to the MSMA material, according to one embodiment consistent with the present invention.
Figure 1C:
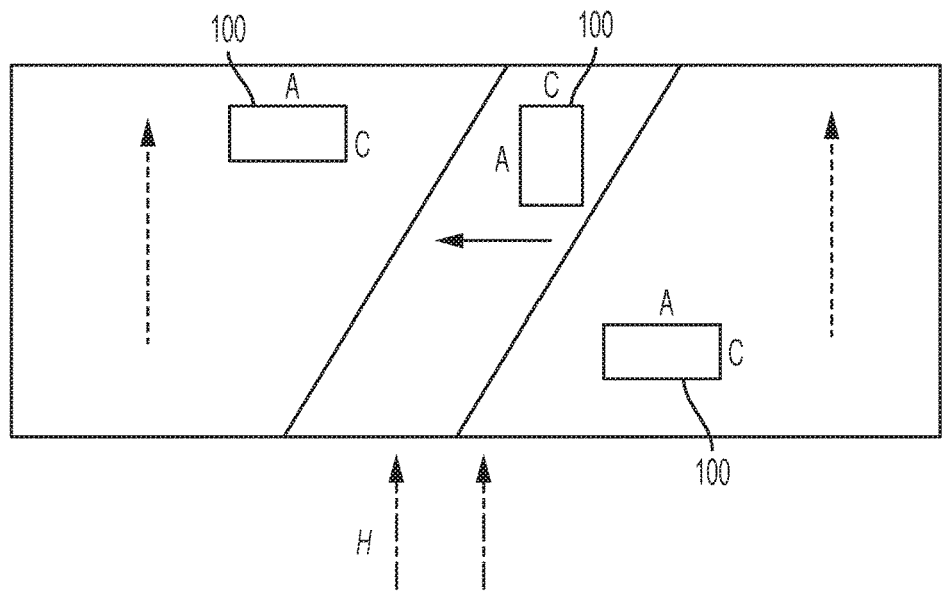
FIG. 1C shows a stronger magnetic field being applied to the MSMA material, according to one embodiment consistent with the present invention.
Figure 1D:
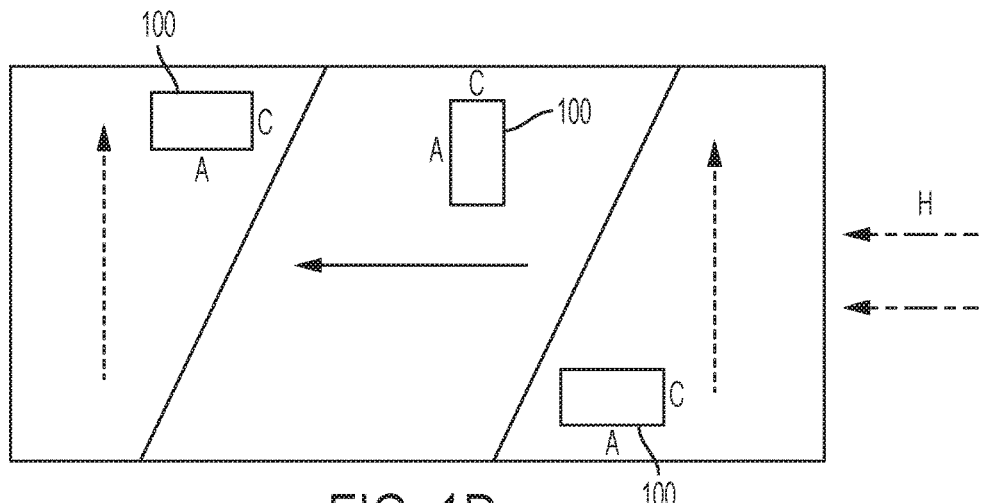
FIG. 1D shows a perpendicular magnetic field being applied to the MSMA material, according to one embodiment consistent with the present invention.
Figure 1E:
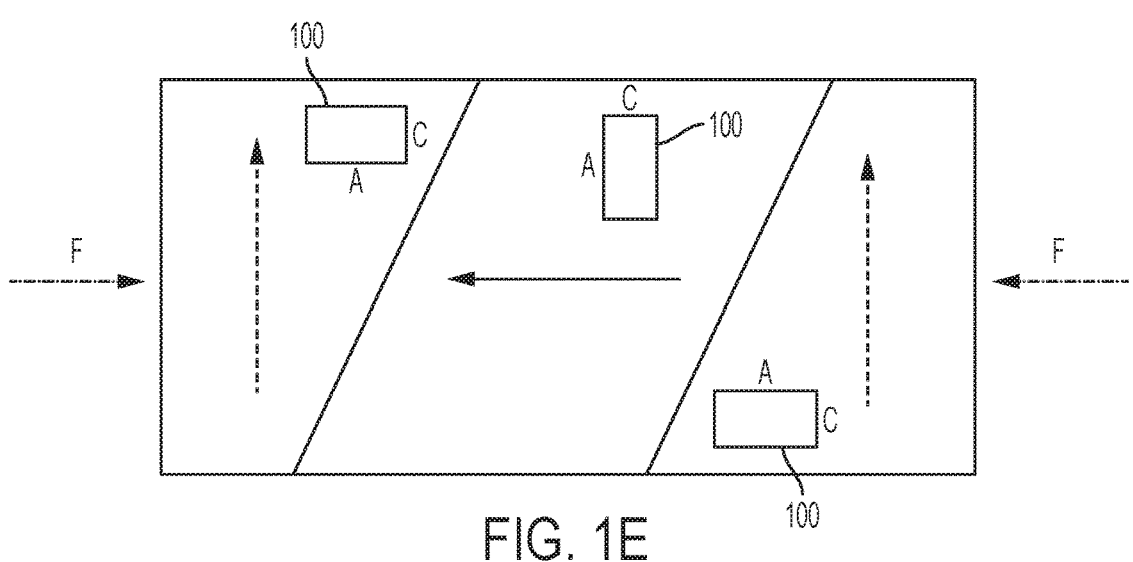
FIG. 1E shows an external restoring force being applied to the MSMA material, according to one embodiment consistent with the present invention.

Specifically, in the martensitic phase, an MSMA (typically an alloy of nickel, manganese and gallium (Ni—Mn—Ga)), is composed of different areas with alternating orientation, called the twin variants (see FIG. 1A which shows the arrows representing the variants in the MSMA). When a small magnetic field is applied to the MSMA material 100 (see FIG. 1B), each variant forms a single orientation of the easy axis of magnetization, or the shorter c-axis. This boundary between the variants is called the twin boundary. When a stronger magnetic field is applied to the material (see FIG. 1C), there is growth in the variants aligned with the field (see FIG. 1D which shows a perpendicular magnetic field being applied). The twin boundaries move, which causes an overall lengthening of the MSMA sample. When the field is removed, the elongation is self-supported until an external force or magnetic field at 90° to the original field, is applied to restore the original shape (see FIG. 1E).

In one exemplary embodiment, the present invention relates to a simple, small linear actuator system using a magnetic shape memory alloy (MSMA), which is capable of self-position sensing and power-off position maintenance. In one exemplary embodiment, the linear actuator system of the present invention is a push-pull type actuator 200 configuration, which is compact, and provides simplicity and usefulness in precision mechanisms (see FIGS. 2A-2B). In one exemplary embodiment, the push-pull actuator 200 of the present invention includes only one magnetic shape memory alloy (MSMA) element 202 with magnetic circuit.

Figure 2A:
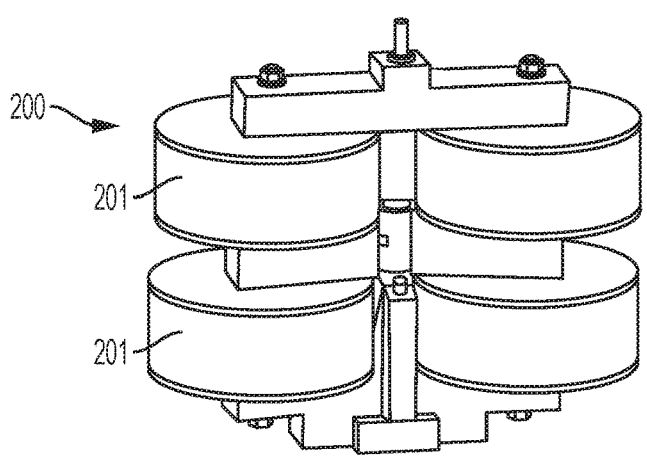
FIGS. 2A-2B show a bottom view and a side view, respectively, of an MSMA actuator, according to one embodiment consistent with the present invention.
Figure 2B:
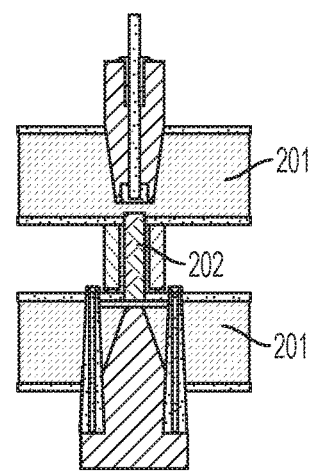

In one exemplary embodiment, the precision actuator 200 of the present invention, includes four coils 201 in a field-inverting arrangement, which directs magnetic flux through the MSMA material 202 (see FIGS. 2A and 2B). In one exemplary embodiment, the two sets of coils 201 are arranged such that for a positive current, one bias field is weakened, and the other bias field is strengthened, and for a negative current, vice versa. The direction of displacement is determined by the exciting current direction. With the present invention having only one element 202 and one magnetic circuit, it provides the advantage of a compact size.

Figure 2C:
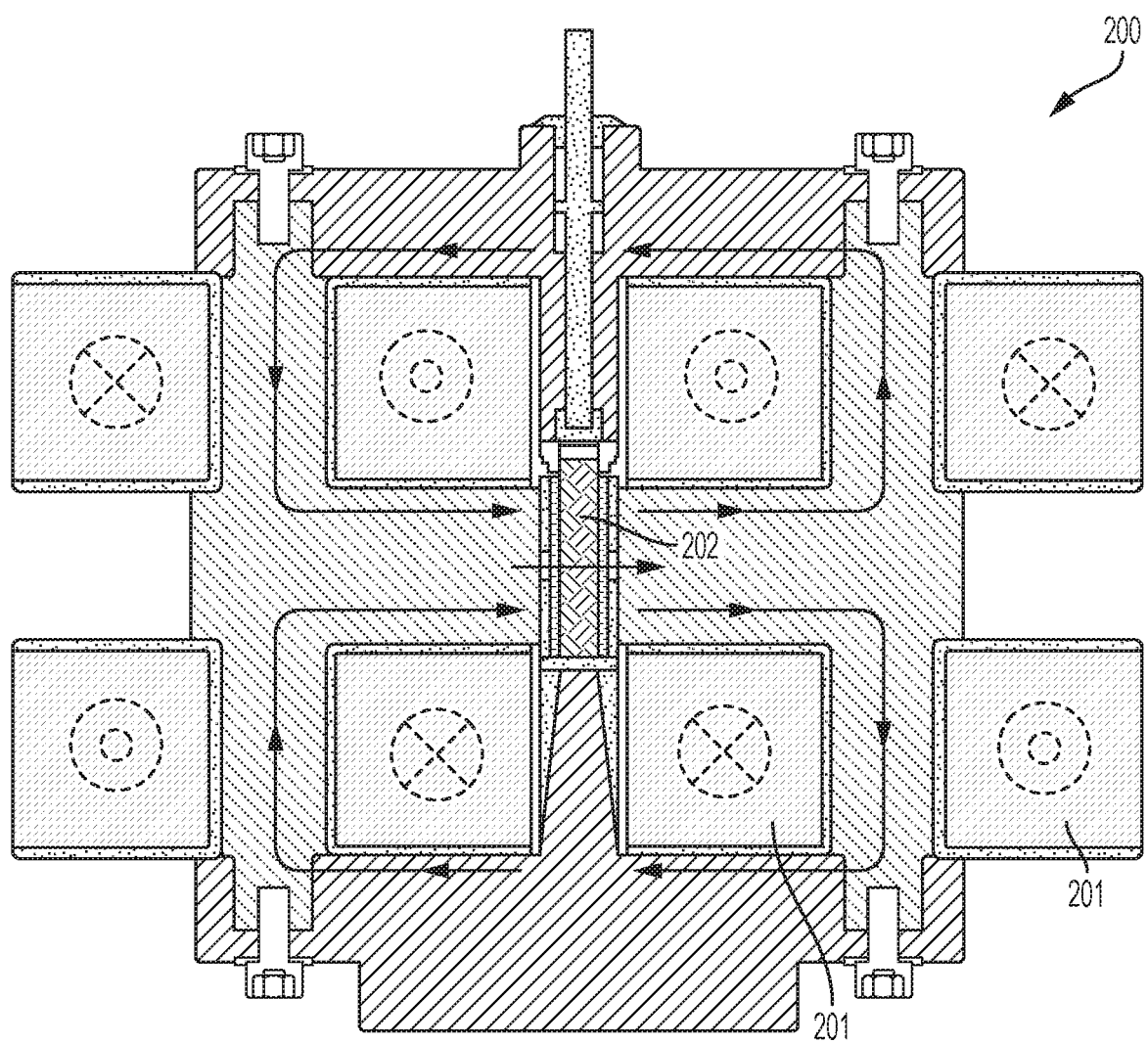
FIG. 2C shows an MSMA actuator in an elongation field, according to one embodiment consistent with the present invention.

Specifically, in one exemplary embodiment, to elongate the MSMA material, the coils 201 drive a magnetic field perpendicular to the axis of motion. FIG. 2C shows the coil configuration required to generate this elongation field.

Figure 2D:
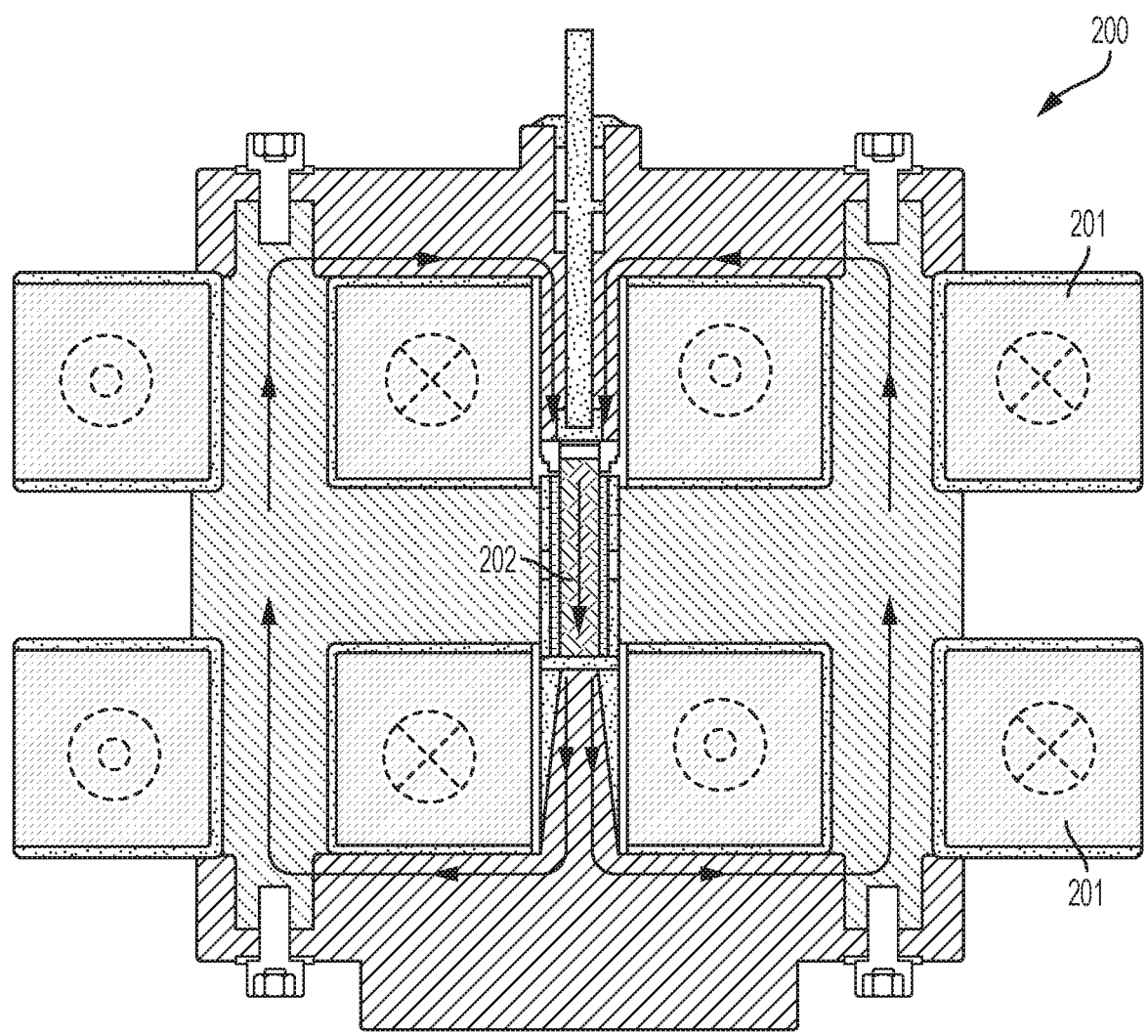
FIG. 2D shows an MSMA actuator in a contracting field, according to one embodiment consistent with the present invention.

To generate the contracting field, the coils 201 must drive a magnetic field parallel to the axis of motion. To accomplish this, two of the coils are inverted as shown in FIG. 2D, which demonstrates the coil configuration required to restore the MSMA material.

The theoretical maximum strain of the MSMA actuator 200 of the present invention is given by the equation: $\varepsilon_{max}=1-c/a$, where c is the short easy axis and a is the long axis. The typical strain achieved is around 6% but strains over 10% have been seen. In one exemplary embodiment, a NiMnGa single crystal MSMA is used in the MSMA actuator 200 of the present invention, and its properties include a response up to 1-2 kHz, a force density of about 2 Mpa, a work output of a maximum 100 kj/m$^3$, a modulus of elasticity of 20-200 GPa, a magnetic field of <0.8 Tesla, and an upper temperature limit which shows transformation from martensitic to austenite at 70° C.

To determine the specific properties of the present invention, the following test procedure was implemented to confirm operations and characterization of hysteresis behavior in strain, accuracy, resolution, repeatability, stiffness, and self-sensing properties, including but not limited, to magnetic shape memory alloy (MSMA) resistance, and drive coils impedance.

Figure 3:
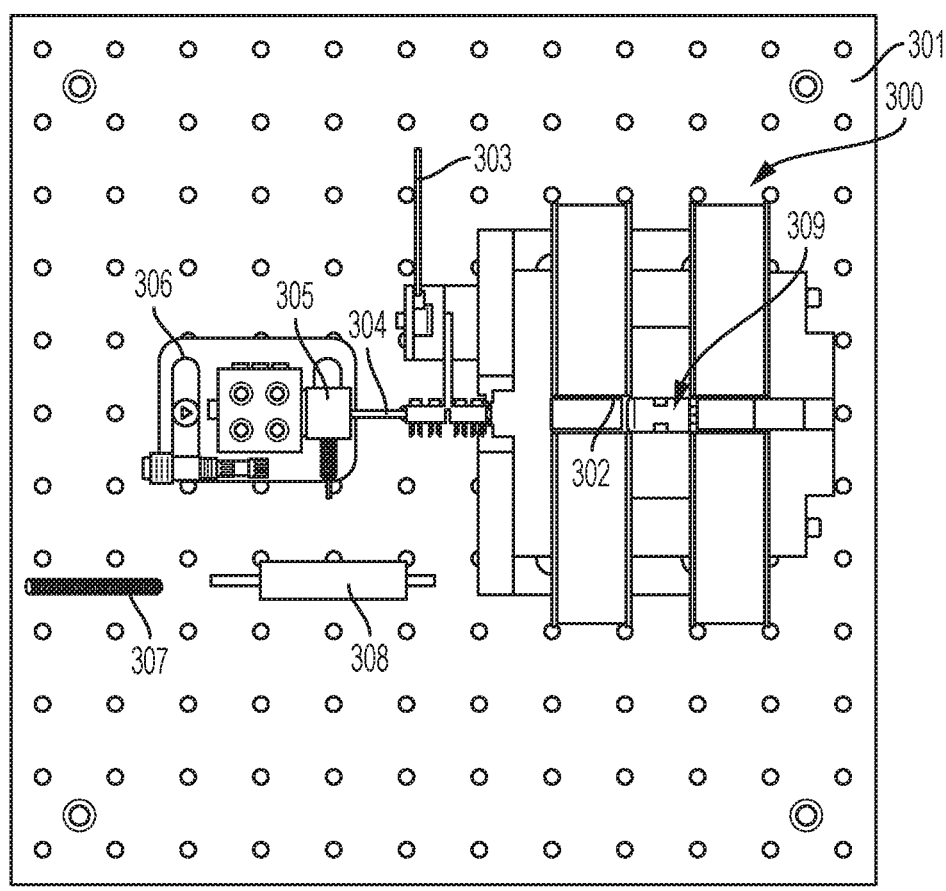
FIG. 3 shows a top view of an MSMA actuator disposed on a test stand, according to one embodiment consistent with the present invention.

In one exemplary embodiment, the MSMA actuator 300 of the present invention was disposed on a test fixture 301 (see FIG. 3). To test the magnetic field force in relation to the current and displacement, a current was induced to elongate the MSMA material 309 to a specific displacement. An electronics circuit measures the resistance change of the magnetic shape memory alloy (MSMA) and impedance change of the drive coils.

The load cell 305 was used to measure the force created by the MSMA material 309 using either a rigid link 304, or a tension spring link 307, or a compression spring link 308. The load cell 305 and micrometer stage 306 can be moved to vary the distance between the alloy and where the force measurement is being taken.

In one exemplary embodiment, the magnetic field was measured using a Gauss-Meter through the probe 302 access ports on both sides of the MSMA material. Similarly to the force measurement, the load cell 305 and micrometer stage 306 can be moved to vary the distance the actuator 300 moves. The theoretical relation between the current used to drive the coils and the magnetic field used for actuation, comes from the magnetic circuit equivalent of Ohm's Law: F=φR=NI. Since magnetic circuits tend not to be as linear as electrical circuits, the magnetic fields need to be measured to confirm the performance of the magnetic structure.

In one exemplary embodiment, to test the displacement in relation to time with a constant current and force load, a force load was applied to the MSMA material 309 to simulate a typical application the actuator 300 will be used in. The Eddy current displacement sensor 303 measured the displacement of the MSMA material 309 when a constant current and force load is applied, and determined the dynamic properties of the actuator 300.

Figure 4:
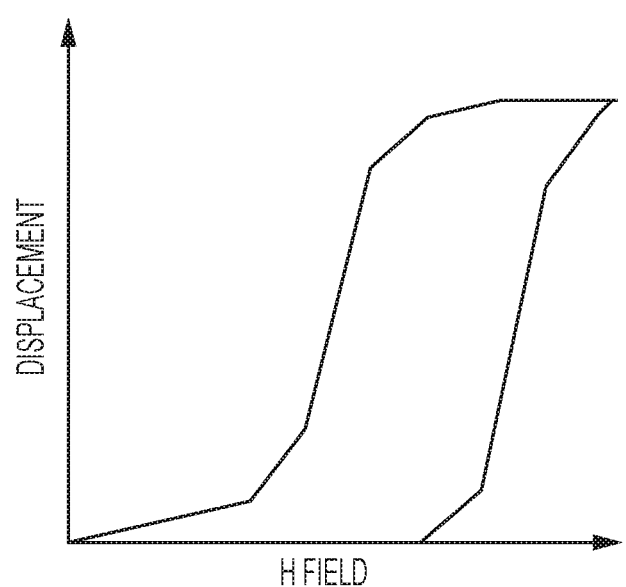
FIG. 4 shows a graph of a hysteresis motion cycle—displacement vs. H field—of an MSMA according to one embodiment consistent with the present invention.

The MSMA exhibits a hysteresis motion cycle as shown exemplarily in FIG. 4. This can be of concern when designing a controller to drive the actuator. In one exemplary embodiment, to determine displacement in relation to current and temperature, the hysteretic behavior of the MSMA is measured at various temperatures and currents, so that a required compensation control algorithm can be deduced. This measurement will also test for the best operation temperature to produce the maximum strain.

In one exemplary embodiment, the MSMA actuator system of the present invention includes a laboratory bench-top linear actuator, breadboard-level control electronics, and a computer command interface. Specifically, the actuator bi-directional displacement is controlled through a computer by changing the current direction in the coils as described above. The drive electronics provides the required current switching capability. The measurements were recorded through data acquisition electronics interfaced with the computer.

The MSMA actuator of the present invention provides many unique features superior to the state-of-the art actuators, including: a) that it requires only one MSMA element; b) it requires only one magnetic circuit with two sets of individual exciting coils; c) the magnetic circuit of the present invention produces a uniform magnetic field in the both directions; and d) it provides provide uniform displacements in both directions.

A large strain and fast response time makes the MSMA actuator of the present invention versatile and applicable in a wide range of applications, in including spaceflight instrumentation. The MSMA actuators of the present invention can replace current shape memory alloy actuators in many spaceflight instrument applications, as well as enable new precision mechanism types, by providing highly precise positioning with accuracy in the nanometer range.

The MSMA linear actuator of the present invention is applicable to any commercial application requiring power-off position hold, nanometric precision, and high dynamic range. The MSMA actuator applications include linear motors, beam-steering mechanisms, mass spectrometers, laser altimeter cavities, micropump systems, vibration isolation, sonar devices, aero flaps, vibration energy harvesters, and breaker switches. The MSMA actuator can also be used for release/restraint devices, fast steering mirrors, and optical positioning devices.

The properties of the MSMA-based actuators of the present invention will increase the accuracy of earth and space science instruments and reduce operational power consumption.

It should be emphasized that the above-described embodiments of the invention are merely possible examples of implementations set forth for a clear understanding of the principles of the invention. Variations and modifications may be made to the above-described embodiments of the invention without departing from the spirit and principles of the invention. All such modifications and variations are intended to be included herein within the scope of the invention and protected by the following claims.

What is claimed is:

1. A push-pull actuator which provides a displacement self-sensing response capability, comprising:
    a plurality of coils disposed in two sets of two coils, in a field-inverting arrangement, said plurality of coils which directs magnetic flux through a magnetic shape memory alloy (MSMA) disposed centrally to said two sets of two coils;
    wherein a positive current is provided through said two sets of two coils, such that of a resulting two bias fields, one bias field is weakened and the other bias field is strengthened, and for a negative current, one bias field is strengthened and the other bias field is weakened;
    wherein a direction of displacement of said magnetic shape memory alloy (MSMA) is determined by a direction of a current applied to said two sets of two coils.

2. The actuator of claim 1, wherein in order to elongate the magnetic shape memory alloy (MSMA), said two sets of two coils drive a magnetic field perpendicular to an axis of motion.

3. The actuator of claim 1, wherein in order to contract the magnetic shape memory alloy (MSMA), said two sets of two coils drive a magnetic field parallel to an axis of motion.

4. The actuator of claim 3, wherein said two sets of two coils are inverted to restore said magnetic shape memory alloy (MSMA) after contraction.

5. The actuator of claim 1, wherein said magnetic shape memory alloy (MSMA) is a single crystal alloy of nickel, manganese and gallium (NiMnGa).

6. The actuator of claim 1, wherein the actuator provides a response up to 2 kHz, a strain of more than 6%, and a modulus of elasticity of 20-200 GPa.

7. The actuator of claim 1, wherein the actuator is used in a test fixture which induces current pulses to elongate said magnetic shape memory alloy (MSMA) to a specific displacement, said test fixture comprising:
    a load cell which is used to measure a force created on said magnetic shape memory alloy (MSMA) using one of a rigid link or a spring link;
    a stage which is moved to vary a distance between said magnetic shape memory alloy (MSMA) and said load cell where said force measurement is taken;
    a Gauss-meter which measures said magnetic field through probe access ports disposed on either side of said magnetic shape memory alloy (MSMA);
    an electronics circuit which measures resistance change of said magnetic shape memory alloy (MSMA) and impedance change of said two sets of coils; and
    an Eddy current displacement sensor which measures said displacement of said magnetic shape memory alloy (MSMA) when said current and said force are applied.

8. The actuator of claim 1, wherein the actuator is used in any application requiring power-off position hold, such as instrument applications.

* * * * *